(12) United States Patent
Boström

(10) Patent No.: US 8,330,542 B2
(45) Date of Patent: Dec. 11, 2012

(54) POWER AMPLIFIER

(75) Inventor: Patrik Boström, Ramiösa (SE)

(73) Assignee: Abletec AS, Hönefoss (NO)

( * ) Notice: Subject to any disclaimer, the term of this patent is extended or adjusted under 35 U.S.C. 154(b) by 0 days.

(21) Appl. No.: 13/266,861

(22) PCT Filed: Apr. 28, 2010

(86) PCT No.: PCT/SE2010/050468
§ 371 (c)(1),
(2), (4) Date: Oct. 28, 2011

(87) PCT Pub. No.: WO2010/126440
PCT Pub. Date: Nov. 4, 2010

(65) Prior Publication Data
US 2012/0044019 A1 Feb. 23, 2012

(30) Foreign Application Priority Data

Apr. 30, 2009 (SE) .................................. 0950295

(51) Int. Cl.
*H03F 3/217* (2006.01)
(52) U.S. Cl. .................. 330/251; 330/207 A; 330/10
(58) Field of Classification Search .................. 330/10, 330/251, 207 A, 278
See application file for complete search history.

(56) References Cited

U.S. PATENT DOCUMENTS

| 4,041,411 | A | 8/1977 | Sturgeon | |
|---|---|---|---|---|
| 7,671,675 | B2 * | 3/2010 | Miyashita et al. | 330/251 |
| 2007/0247219 | A1 | 10/2007 | Jesus Rodriguez | |

FOREIGN PATENT DOCUMENTS

| WO | 9938255 A2 | 7/1999 |
|---|---|---|
| WO | 0022727 A1 | 4/2000 |
| WO | 03090343 A2 | 10/2003 |

OTHER PUBLICATIONS

"PCT International Search Report for PCT/SE2010/050468 dated Aug. 27, 2010, from which the instant application is based," 3 pgs.
"PCT Written Opinion for PCT/SE2010/050468 dated Aug. 27, 2010, from which the instant application is based," 4 pgs.

* cited by examiner

*Primary Examiner* — Hieu Nguyen
(74) *Attorney, Agent, or Firm* — Fredrikson & Byron, PA

(57) ABSTRACT

Power amplifier for amplifying an electric input signal in an operational frequency range and providing an output signal, comprising switching means (12) for generating a block wave signal by alternately switching the block wave signal to a first supply voltage or a second supply voltage, input means for receiving the electric signal and driving the switching means, wherein the input means comprises an integrator circuit (10) integrating an error signal formed by a difference between the output signal and the electric input signal and providing an integrator gain in the operational frequency range, the power amplifier further comprising a local feedback circuit (18), and a global feedback circuit (20), an output of the integrator circuit being connected the input of the switching mean A limiter circuit (22) is connected to receive the electric input signal and an output signal of the integrator circuit and connected to the integrator circuit for limiting the gain of the integrator circuit when detecting a difference between the electric input signal and the output signal of the integrator circuit exceeding a predetermined value.

7 Claims, 4 Drawing Sheets

POWER AMPLIFIER

RELATED APPLICATIONS

This application is a 35 U.S.C. 371 national stage filing from International Application No. PCT/SE2010/050468 filed Apr. 28, 2010, and claims priority to Swedish Application No. 09050295-6 filed Apr. 30, 2009, the teachings of which are incorporated herein by reference.

TECHNICAL FIELD

Power amplifier for amplifying an electric input signal in an operational frequency range and providing an output signal, comprising switching means for generating a block wave signal by alternately switching the block wave signal to a first supply voltage or a second supply voltage, filter means for generating a power output signal by low pass filtering the block wave signal, input means for receiving the electric signal and driving the switching means, and a local feedback circuit connecting the output signal to an input of the switching means.

PRIOR ART

Switching power amplifiers also referred to as pulse modulation amplifiers, pulse width modulation (PWM) amplifiers or class D amplifiers are commonly used in applications where power dissipation is an important factor. Class d amplifiers are important for lowering power consumption and decreasing the size/weight and hence the use of raw materials.

In such amplifiers there is an input stage for receiving an electrical input signal to be amplified, a modulating/switching or power stage and a filter. The switching stage generates a block wave signal, or a pulse train, which has a frequency that is much higher than the highest frequency in the operational frequency range of the electric signal to be amplified. The pulse width ratio of the block wave is modulated so that the average value of the block wave signal is proportional to the input signal. The filter filters the block wave signal to a power output signal.

Another definition of class d amplifiers is that the power stage which delivers the energy to the load is operated in an "on/off" state where the average voltage value of this square wave is modulated to correspond to the set value. The only losses that appear are the low conduction losses during the "on" state and the switching losses from each time the output stage changes state.

The switching between on and off is made at a frequency which normally is around 400 kHz or more giving a high enough resolution in the audible band. Normally, a class d amplifier contains a second order low pass filter with a preferably high Q value for demodulating the PWM pulses. This filter shifts the phase assymptotically towards −180° and the higher the Q value the faster it reaches −180°. When the filter is loaded the Q value decreases.

The actual pulse width modulation can be performed in several different ways. The most obvious way is to use a reference signal, for example a tri wave signal and then compare the input or set value to this reference signal. Each time those signals intersect the output stage changes state. A disadvantage with this reference signal technique is that the average value of the pulse train only corresponds to the set value as long as the supply voltages are constant and the state shift is infinitely fast plus of course, the tri wave has to be ideal.

The reference signal technique does not have any feedback what so ever resulting in an absence of control over the demodulation filter. There is actually two signal paths, one from the input to the output and one from the supply rails to the output. The channel separation and power supply rejection become very poor. One single advantage is that the switching frequency is constant. Supply feed forward can be used to lower the supply voltage dependence.

Using a digital device as a DSP for calculating the pulse width instead of comparing the set value to a tri wave signal basically gives the same result. However there are more possibilities to compensate for non ideal features of components. A DSP solution also is more complicated and expensive.

A very effective way of providing the pulse width modulation is by self oscillation. A comparator is used to compare the average of the pulse train to the set value and if the error is negative the positive switch is turned on and vice versa if it is positive. The frequency of operation is close to the frequency where the loop has −180° phase shift. Some solutions use the demodulation filter to do the averaging and this gives the amplifier the possibility to adjust errors that occur in and after the demodulation filter.

Without additional circuitry the switching frequency would be equal to the filter resonance frequency which usually is around 50 kHz and this is not acceptable. A zero and zero cancelling resistor is added in the sensing circuit to push the frequency up about a decade. This zero increases the amplitude of the modulation signal and this decreases the loop gain hence increases the non linearities. The result of this post filter self oscillating topology is therefore that the linear distorsion (distorsion which does not add new frequency content like amplitude and phase) is very low for being a class d amplifier but the non linear distorsion is poor. An early disclosure of a self oscillation class D amplifier was made by Clayton Sturgeon in Texas who filed a patent application in 1976 with serial number U.S. Pat. No. 4,041,411.

A later prior art document is WO03/090343 disclosing a power amplifier for amplifying an electric signal in an operational frequency range comprising switching means for generating a block wave signal by alternately switching the block wave signal to a first supply voltage or a second supply voltage, filter means for generating a power output signal by low pass filtering the block wave signal, input means for receiving the electric signal and driving the switching means, and a control circuit coupled to the output power signal and the input means for controlling the power amplifier.

A further option is to add a second order active integrator which demodulates the pulse train and gives an enormous amount of loop gain at low frequencies. The switching frequency is then entirely controlled by this integrator and not at all by the Q value of the output filter. The operation of this pre filter self oscillating topology is therefore very robust and simple and it gives very low non linear distorsion, especially at low frequencies.

However, in a pre filter self oscillating topology the linear distortion becomes high i.e. the frequency response and phase is totally load dependant and a desired response curve can only be obtained with specific load impedance. The switching frequency of all self oscillating topologies varies with the modulation depth (pulse width). This is an advantage for the efficiency as the switching losses becomes lower as the conduction losses increase but if another loop is added to increase the loop gain there is a risk that this loop picks up the switching frequency and then the amplifier would go into a destructive sub harmonic oscillation condition.

There is a need to increase the loop gain in order to lower the non linear and linear distorsion of self oscillating class d amplifiers. This is usually done by including an integrator which integrates the difference between the output signal and input signal, forming an error signal, to further increase the loop gain in the audible band and hence lowering the non idealities in the audible band. This gives at least one problem. At start up, before the class d stage starts to operate, or during output clipping the integrator will be fed a large error signal which will be integrated until the integrator saturates and then the error keeps charging the integrating capacitor. This causes the integrator to hang up.

Thus, there is a desire to remove this hang up behaviour in order to be able to use an integrator in combination with a class d amplifier stage.

SUMMARY OF THE INVENTION

In accordance with the invention the drawbacks and problems of prior art amplifiers are overcome by providing a self oscillating class D amplifier having a power stage with a local feedback loop giving a local gain, and by providing a global feedback loop giving a global gain, wherein the local gain substantially is equal to the global gain. By maintaining the local gain equal, or substantially equal, to the global gain the result will be that the output signal from the integrator has the same amplitude as the input signal to the integrator plus an error signal.

Furthermore, a limiter circuit is provided to measure the difference between the input and the output of the integrator and if this difference exceeds a preset threshold the limiter circuit is activated to decrease the gain of the integrator substantially and eventually to set the gain of the integrator to near unity or to unity. This means that when the class d stage can not follow the input signal, as during startup or during clipping, the integrator only has unity gain.

BRIEF DESCRIPTION OF THE DRAWINGS

In order that the manner in which the above recited and other advantages and objects of the invention are obtained will be readily understood, a more particular description of the invention briefly described above will be rendered by reference to specific embodiments thereof which are illustrated in the appended drawings.

Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

Figure 1:
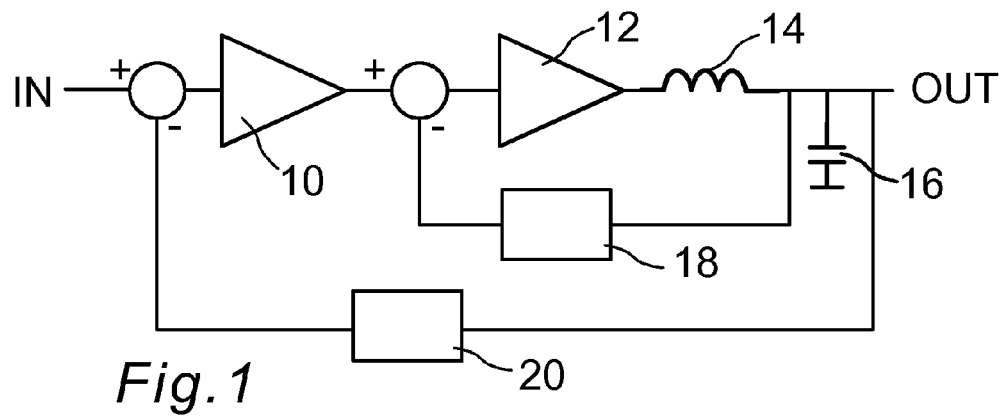
FIG. 1 is a schematic block diagram of a prior art class D amplifier.

In the prior art amplifier shown in FIG. 1 a non-inverting first input of an integrator circuit 10 receives an electric input signal. An output of the integrator circuit 10 is connected to a switching means 12. A power output from the switching means 10 is connected to a low pass filter comprising an inductor 14 and a capacitor 16. From the inductor 14 a local feedback loop 18 connects to an inverting input of the switching means 13. A non-inverting input of the switching means 13 is connected to an output of the integrator circuit 10. A global feedback loop 20 connects the inductor 14 to an inverting second input of the integrator circuit 10. During clipping conditions the integrator hangs up and this causes a high amount of audible artefacts. A possible improvement would be to keep the supply voltage at a lower level in order to limit how much the integrator hangs up but this would not solve the issues during startup or current limit situations.

Figure 2:
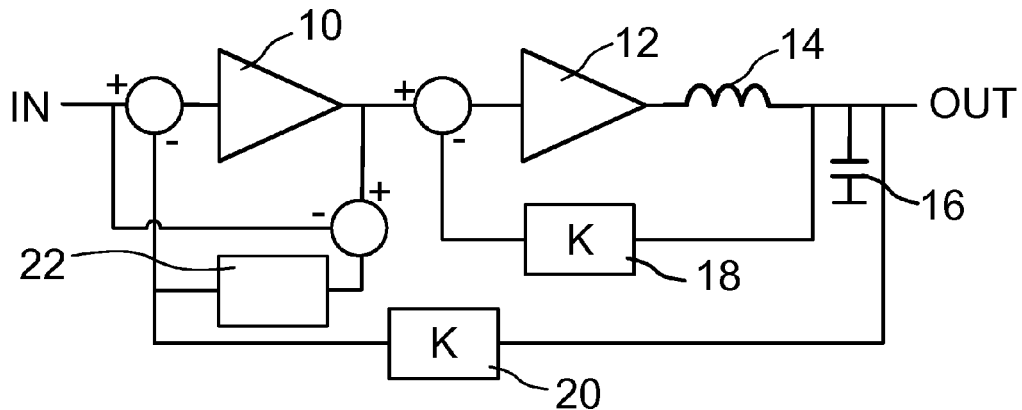
FIG. 2 is a schematic block diagram of a basic embodiment of an amplifier in accordance with the invention.
Figure 5:
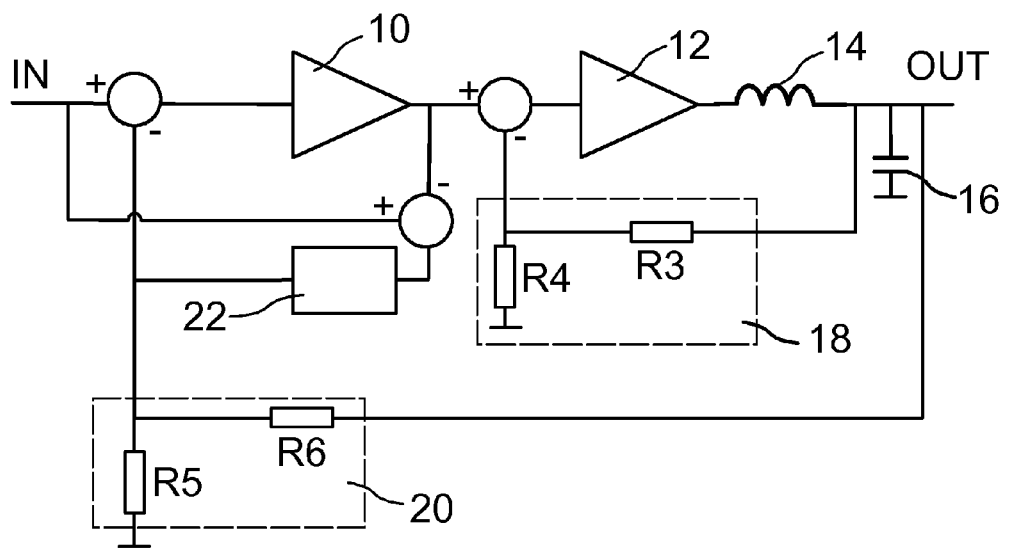
FIG. 5 is a more detailed block diagram of the embodiment of FIG. 2.

In the embodiment of an amplifier in accordance with the invention shown in FIG. 2 and FIG. 5 a limiter circuit 22 instead is connected to measure the difference between the output of the integrator circuit and the electric input signal. In the embodiment shown in FIG. 2 a non-inverting input of the limiter circuit is connected to the output of the integrator circuit and an inverting input of the limiter circuit is connected to receive the electric input signal. A limiter output is connected to the inverting second input of the integrator circuit.

The local feedback loop results in a local gain of 1/K+1 and the integrator circuit 10 aims to keep also a global gain at 1/K+1. As a result the output signal from the integrator has the same amplitude as the input signal to the integrator plus an error signal. The limiter circuit measures the difference between the input and the output of the integrator and if this difference exceeds a preset threshold value the limiter circuit is activated to set the gain of the integrator to near unity. This means that when the class d stage can not follow the input signal, such as during startup or during clipping, the integrator only has unity gain.

Figure 3:
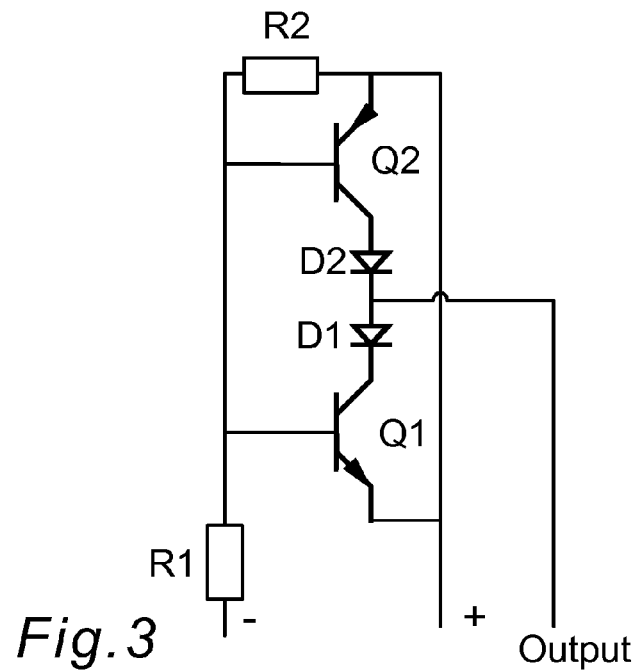
FIG. 3 is a basic circuit diagram of one embodiment of a limiter circuit included in the amplifier in accordance with the invention.

In the embodiment of a limiter circuit shown in FIG. 3 first resistor R1 and second resistor R2 determines and can be used to adjust the amount of difference that is accepted between the input and output of the integrator circuit 10. A first transistor Q1 starts to conduct and decrease the output when the base-emitter voltage is about 600 mV. By choosing R1 and R2 to have a resistance of 1 kohm the maximum allowed error voltage is 1.2V.

Figure 4:
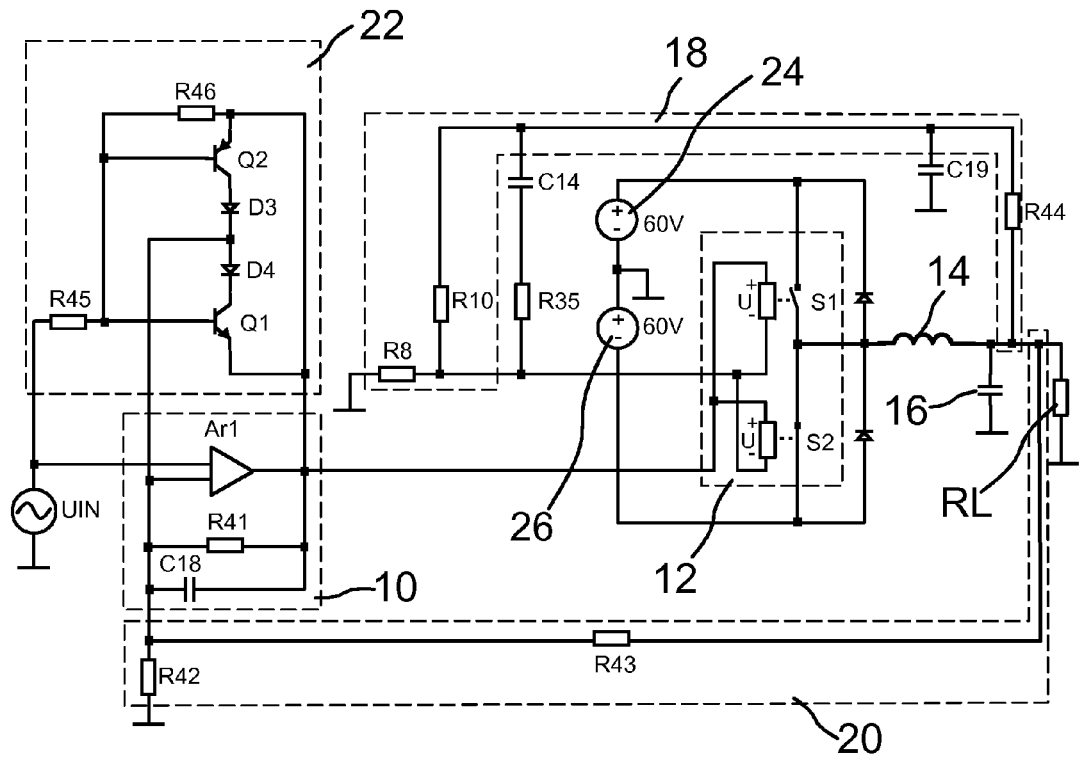
FIG. 4 is a schematic circuit diagram of one embodiment of an amplifier in accordance with the invention.

A simulation model of a post filter self oscillation class d amplifier stage with an integrator in front to increase the loop gain in the audio band is shown in FIG. 4. Below only components with appreciable properties in a technical sense are mentioned specifically.

A first switch S1 switches on at 0.001V and switches off at 0V. A second switch S2 has opposite turn on and turn of values. Switches S1 and S2 are connected to a first voltage source 24 and a second voltage source 26, respectively. Voltage sources 24 and 26 supply the required or available voltage, such as 60V in the shown embodiment. Together S1 and S2 form the switching means 12 based on a comparator and power stage. Resistor R44 and capacitor C19 approximate the propagation delay in the comparator-switch stage (which is there in real life). The local gain in the class d stage is determined by resistor R10 and resistor R8 and is fixed to be equal to the global gain, which is determined by resistor R43 and resistor R42. The output of the switching means 12 is fed through inductor 14 and received by a load RL.

Amplifier circuit AR1 forms the integrator circuit 10 where capacitor C18 functions as a pole and resistor R41 limits the DC gain. In the shown embodiment AR1 has +/−15V as supply voltage. Capacitor C14 and resistor R35 pushes the switching frequency away from the filter resonance frequency up to a desired much higher frequency.

Figure 8:
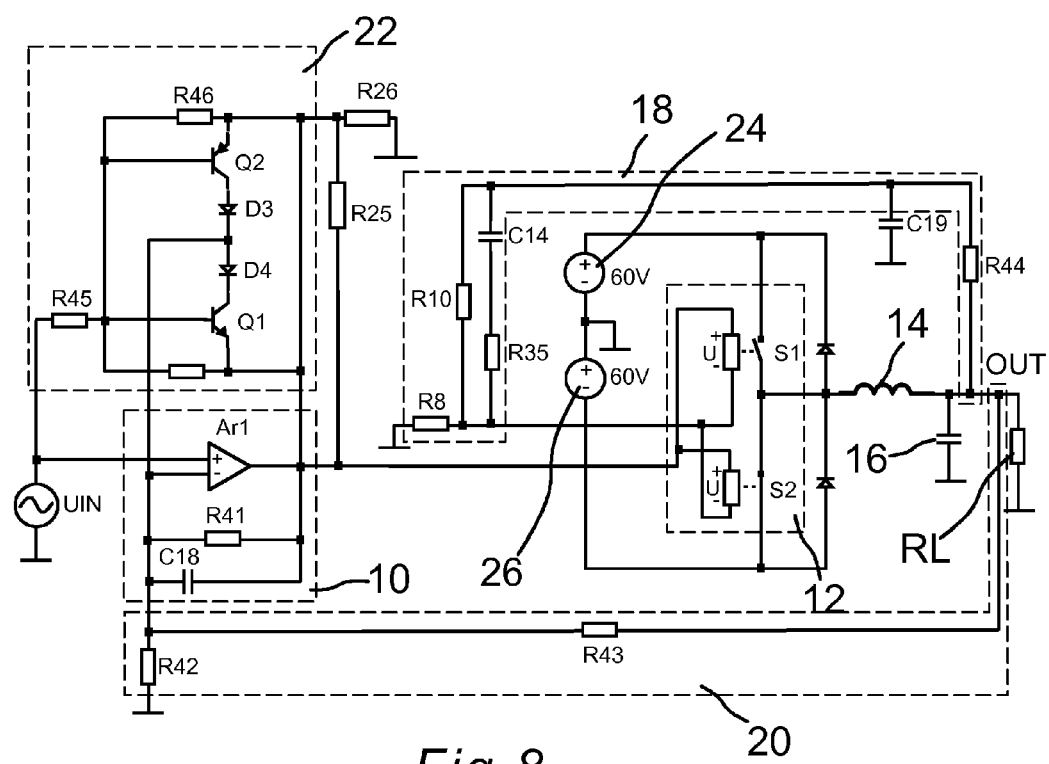

The limiter circuit 22 is formed by resistor R45, resistor R46, transistor Q1, transistor Q2, diode D3 and diode D4. Voltage source UIN represents an electric input signal. A full output signal of the integrator circuit 10 is received by the limiter circuit resulting in a required gain of 1.0 of the integrator circuit 10. If a fraction of the output signal of the integrator circuit 10 is fed to the limiter circuit the required gain of the integrator circuit 10 is increased correspondingly (c.f. FIG. 8 and description) below. By selecting R45 to be 1 kohm and R46 to be 10 kohm the allowed error is decreased to around 600 mV. Resistors R42 and R43 form the global feedback loop 20.

In the embodiment shown in FIG. 5 the local feedback loop 18 comprises resistors R3 and R4. The resulting local gain is R3/R4+1. Correspondingly the global feedback loop 20 comprises resistors R5 and R6 resulting in a global gain that is R6/R5+1.

The alternative embodiment shown in FIG. 6 has an inverting integrator 10' and an alternative embodiment of a limiter 22' (further described with reference to FIG. 7 below). A local feedback loop 18' is used in a non-inverting amplifier and switching means 12 and comprises resistors R9 and R10. The resulting local gain will be R9/R10+1. A global feedback loop 20' comprises resistors R7 and R8 where R8 connects between the output OUT and an input of the inverting integrator 10'. The resulting global gain will be R8/R7.

Figure 6:
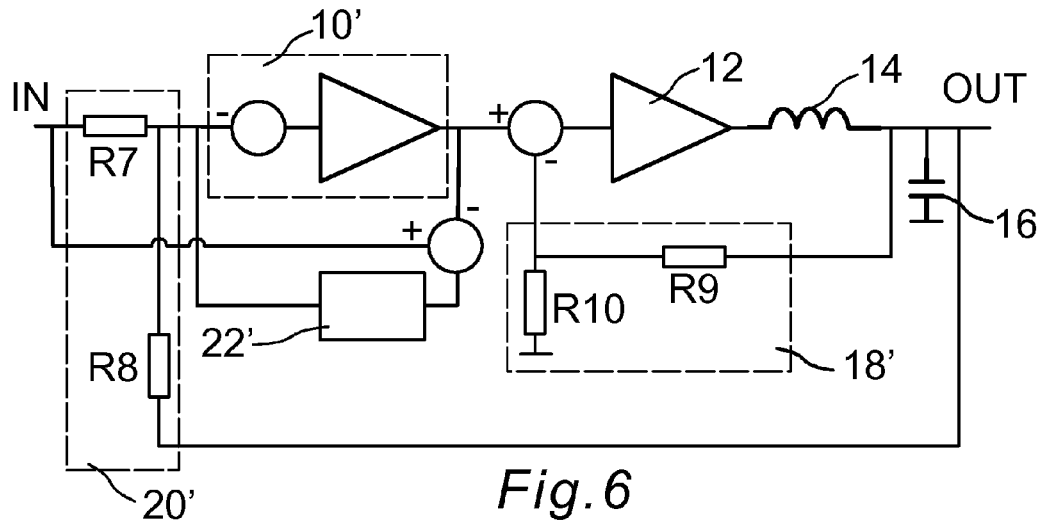
FIG. 6 is a block diagram of an inverting embodiment of an amplifier in accordance with the invention.
Figure 7:
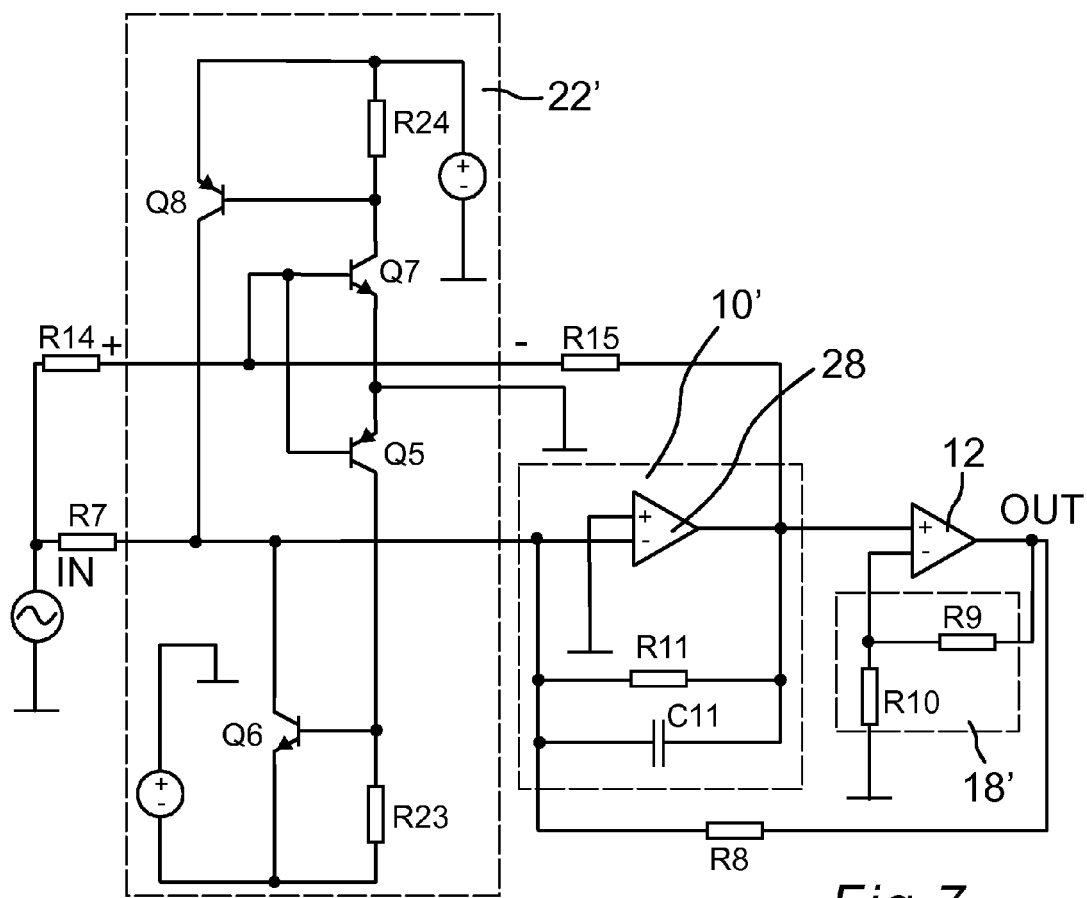
FIG. 7 is a schematic circuit diagram of an inverting embodiment of an amplifier in accordance with the invention and FIG. 8 is a schematic circuit diagram of an alternative embodiment of an amplifier in accordance with the invention.

The schematic circuit diagram of FIG. 7 corresponds to the block diagram of FIG. 6. Switching means 12 forms together with resistors R9 and R10 a local non-inverting amplifier. An inverting integrator is formed by amplifier circuit 28, resistor R11 and capacitor C11. Amplifier circuit 28 together with resistors R7 and R8 form an inverting integrator 10' with a global feedback loop. The amplifier circuit 28 has an output 29 connecting to the switching means 12.

The alternative embodiment of the limiter 22' shown in FIG. 7 is based on a balance point between resistors R14 and R15. As long as the balance point remains at a zero value the limiter 22' is not active. However, should the output 29 of the amplifier circuit 28 start to drift off as a result of clipping the balance point will drift off from the zero value to an error value. When the error value reaches a predetermined value, in the shown embodiment about 600 mV, either transistor Q5 or transistor Q7 is activated and current is passed through either resistor R23 or resistor R24. As a result also either of transistor Q6 or transistor Q8 will conduct to decrease the error value and to prevent saturation.

In the embodiment shown in FIG. 7 an integrator gain of the integrator circuit 10' is equal to R15/R14. The integrator gain multiplied by the gain of the local feedback loop 18' should be equal to the gain of the global feedback loop formed by resistor R7 and resistor R8. The switching means 12 of course can be implemented as shown in FIG. 4 and in FIG. 8 (below), respectively.

In the embodiment shown in FIG. 8 the limiter circuit 22 is connected to compare an input signal UIN and a fraction of an output signal of the integrator circuit 10. The fraction is determined by resistor R25 and resistor R26. If resistor R25 is equal to resistor R26 the fraction is ½. In this case the local feedback loop 18 has a gain of R8+R10/R8 that multiplied with an integrator gain will have to be equal, or substantially equal, to the global gain determined by resistor R42 and resistor R43. By selecting resistor R42 and resistor R43 to provide a gain of 9.0 and selecting resistor R10 and resistor R8 to provide a gain of 4.5 the integrator gain will be 2.0.

In accordance with the invention there has been provided a class d amplifier stage with 1/K+1 in gain and an integrating error amplifier in front striving to produce a global gain of 1/K+1 as well and also having a limiter which compares the input signal to the output of the error amplifier and limits, by acting on the negative input of the error amplifier, the error to a desired level.

While certain illustrative embodiments of the invention have been described in particularity, it will be understood that various other modifications will be readily apparent to those skilled in the art without departing from the scope and spirit of the invention. Accordingly, it is not intended that the scope of the claims appended hereto be limited to the description set forth herein but rather that the claims be construed as encompassing all equivalents of the present invention which are apparent to those skilled in the art to which the invention pertains.

The invention claimed is:

1. Power amplifier for amplifying an electric input signal in an operational frequency range and providing an output signal, comprising switching means (12) for generating a block wave signal by alternately switching the block wave signal to a first supply voltage or a second supply voltage, filter means (14, 16) for generating a power output signal by low pass filtering the block wave signal, input means for receiving the electric signal and driving the switching means, wherein the input means comprises an integrator circuit (10) generating an error signal formed by a difference between the output signal and the electric input signal and providing an integrator gain in the operational frequency range, the power amplifier further comprising a local feedback circuit (18) connecting the output signal to an input of the switching means, and a global feedback circuit (20) connecting the output signal to a first input of the integrator circuit (10), an output of the integrator circuit being connected to the input of the switching means, characterised in that a limiter circuit (22) is connected to receive the electric input signal and an output signal of the integrator circuit and connected to the integrator circuit for limiting the gain of the integrator circuit when detecting a difference between the electric input signal and the output signal of the integrator circuit exceeding a predetermined value.

2. Power amplifier in accordance with claim 1, wherein a first input of the limiter circuit (22) is connected to an input of the input means, a second input of the limiter circuit is connected to the output of the integrator circuit (10), and an output of the limiter circuit (22) is connected to a second input of the integrator circuit (10).

3. Power amplifier in accordance with claim 2, wherein the first input of the integrator circuit (10) is an inverting input and the second input of the integrator circuit is a non-inverting input.

4. Power amplifier in accordance with claim 1, wherein the operational frequency range is an audible frequency band.

5. Power amplifier in accordance with claim 1, wherein the global feedback circuit has a gain that substantially is equal to a gain of the local feedback circuit multiplied by the integrator gain.

6. Power amplifier in accordance with claim 1, wherein the switching means (12) comprises a first switch (S1) and a second switch (S2), the first switch (S1) switching in a first voltage source (24) and the second switch (S2) switching in a second voltage source (26) to form the output signal.

7. A method of amplifying an electric input signal in an operational frequency range and providing an output signal by generating a block wave signal by alternately switching the block wave signal to a first supply voltage or a second supply voltage, low pass filtering the block wave signal, providing a local feedback of the output signal to an input of the switching means, providing a global feedback of the output signal to a first input of the integrator circuit, integrating and amplifying an error signal formed by a difference between the input signal and the output signal, adding the integrated and amplified error signal to the switching means, characterised by determining a difference between the electric input signal and the integrated and amplified error signal, limiting amplification of the error signal when the difference between the electric input signal and the integrated and amplified error signal exceeds a predetermined value.

* * * * *